United States Patent [19]

Ishikawa

[11] Patent Number: 4,987,380

[45] Date of Patent: Jan. 22, 1991

[54] GAIN CONTROLLED AMPLIFIER CIRCUIT

[75] Inventor: Tsutomu Ishikawa, Gunma, Japan

[73] Assignee: Sanyo Electric Co., Ltd., Moriguchi, Japan

[21] Appl. No.: 390,055

[22] Filed: Aug. 7, 1989

[30] Foreign Application Priority Data

Aug. 12, 1988 [JP] Japan ................................. 63-202224

[51] Int. Cl.$^5$ ........................... H03F 3/45; H03G 3/30
[52] U.S. Cl. ..................................... 330/254; 330/257
[58] Field of Search ................................. 330/254, 257

[56] References Cited

U.S. PATENT DOCUMENTS 4,379,995  4/1983  Yamada et al. ..................... 330/254
4,516,081  5/1985  Katakura ............................. 330/254

OTHER PUBLICATIONS

"Nikkei Electronics", issued Jun. 27, 1988; pp. 88–89.

Primary Examiner—James B. Mullins
Attorney, Agent, or Firm—Armstrong, Nikaido, Marmelstein, Kubovcik & Murray

[57] ABSTRACT

A gain controlled amplifier circuit includes a prior stage amplifier circuit (22) for amplifying an input signal, differentially connected first and second transistors (28, 29), and a current source transistor (27) connected to a common emitter of the first and the second transistors. An output current of the prior stage amplifier circuit is provided to the current source transistor, and a control signal is provided between bases of the first and the second transistors. A collector current of the second transistor is provided from an output terminal (31) as an output current, while a collector current of the first transistor is negatively fed back to the prior stage amplifier circuit through a negative feedback path (30).

4 Claims, 3 Drawing Sheets

GAIN CONTROLLED AMPLIFIER CIRCUIT

BACKGROUND OF THE INVENTION

1. Field of the Invention

The present invention relates to a gain controlled amplifier circuit, and more specifically, to a gain controlled amplifier circuit suitably employed, for example, in a surround-decoder system for an audio signal processing of a large sized television, and suitable for an IC (Integrated Circuit).

2. Description of the Background Art

An article related to a Dolby Pro Logic Surround System proposed by Dolby Laboratories Licensing Corp. of the United States appears on pp. 88–89 in "NIKKEI Electronics" issued on June 27, 1988. As shown in FIG. 2, the system is comprised of left and right input terminals 1 and 2 to which left and right stereo signals $L_T$ and $R_T$ are applied, a first adder circuit 3 for adding the left and right stereo signals $L_T$ and $R_T$ to generate a sum signal C' ($=L_T+R_T$), a subtractor circuit 4 for subtracting the right stereo signal $R_T$ from the left stereo signal $L_T$ to generate a difference signal S' ($=L_T-R_T$), first and second detection circuits 5 and 6 for respectively detecting levels of the left and right stereo signals $L_T$ and $R_T$, third and fourth detection circuits 7 and 8 for respectively detecting levels of the sum and difference signals C' and S', a first level ratio detection circuit 9 for detecting a level ratio of the output signals of the first and second detection circuit 5 and 6, a second a level ratio detection circuit 10 for detecting level ratio of the output signals of the third and fourth detection circuits 7 and 8, a VCA (Voltage Controlled Amplifier) 11 including a plurality of gain controlled amplifier circuits (not shown) each for controlling the level of the left or right stereo signal $L_T$ or $R_T$ in response to any one of the output signals of the first and second level ratio detection circuits 9 and 10, a second adder circuit 12 for selectively adding the left and right stereo signals and output signals of the VCA 11 to generate left and right stereo output signals L and R, a center output signal C and a surround output signal S, a center mode control circuit 13 for switching between the left and right stereo output signals L and R and the center output signal C in response to a mode, and a passive decoder 14 for performing signal processing such as delay and noise reduction to the surround output signal S. Therefore, a structure such as shown in FIG. 2 enables signal processing of enhancement of direction to clarify surround localization of sound, so that acoustics having presence can be provided to listeners. Particularly, the system is effective when applied to an audio signal processing of a large-sized television, so that it can produce the same effect on an audience as that obtained when seeing a movie at a theater.

For the gain controlled amplifier in the VCA 11 of FIG. 2, a differential gain controlled amplifier circuit as shown in FIG. 3 can be employed. In FIG. 3, a gain controlling signal Vc is applied between bases of differentially connected first and second transistors 15 and 16, and an input signal to be amplified such as $L_T$ or $R_T$ is applied to a base of a current source transistor 17 having its collector connected to a common emitter of the first and second transistors 15 and 16. Then, an output signal is provided from a collector of the second transistor 16 to an output terminal 18. In FIG. 3, when collector currents of the first and second transistors 15 and 16 are represented as $i_1$ and $i_2$, respectively, the relation between the controlling voltage Vc applied between control terminals 19 and 20 and the collector currents $i_1$ and $i_2$ will be represented in the following equation:

$$Vc = \frac{kT}{q} \ln \frac{i_2}{i_1} \tag{1}$$

Wherein
 q: electric charge of electron
 k: Boltzmann's constant
 T: absolute temperature In addition, if a collector current of the current source transistor 17 flowing in response to a level of an input signal is represented as $i_{IN}$, the following relation will be established.

$$i_{IN} = i_1 + i_2 \tag{2}$$

Accordingly, if equations (1) and (2) are applied, an output current $i_{OUT}$ obtained at the output terminal 18 will be represented in the following equation:

$$i_{OUT} = i_2 = \frac{\exp\left(\frac{qVc}{kT}\right)}{1 + \exp\left(\frac{qVc}{kT}\right)} i_{IN} \tag{3}$$

and, a current gain $G_i$ of the circuit shown in FIG. 3 will be represented in the following equation:

$$G_i = \frac{i_{OUT}}{i_{IN}} = \frac{\exp\left(\frac{qVc}{kT}\right)}{1 + \exp\left(\frac{qVc}{kT}\right)} \tag{4}$$

As apparent from equation (4), the circuit of FIG. 3 has a problem in linearity of its amplification characteristics.

Especially when used in such a surround-decoder system as shown in FIG. 2, if linearity of VCA 11 is bad, a balance of the left and right stereo output signals L and R, the center output signal C and the surround output signal S is affected, so that enough surround effect could not be obtained.

SUMMARY OF THE INVENTION

An object of the present invention is to provide a gain controlled amplifier circuit in which linearity of gain and characteristics such as distortion factor and the like are improved.

Another object of the present invention is to provide a gain controlled amplifier circuit in which enough surround effect can be obtained when used in a surround-decoder system.

A gain controlled amplifier circuit according to the present invention, in short, is comprised of a prior stage amplifier circuit for amplifying an input signal, differentially connected first and second transistors, and a current source transistor connected to a common emitter of the first and the second transistors, an output current of the prior stage amplifier circuit being supplied to the current source transistor, a controlling signal being supplied between bases of the first and the second transistors, a collector current of the second transistor being supplied to an output terminal as an output current, and a collector current of the first transistor is negative fed back to the prior stage amplifier circuit.

According to the present invention, the input signal is amplified in the prior stage amplifier circuit, so that an output current of the prior stage amplifier circuit is supplied to the current source transistor. Therefore, the collector current of the current source transistor corresponds to the input signal. The collector current is differentially amplified by the first and the second transistors. Since the gain controlling signal is applied between the bases of the first and the second transistors at this time, the collector current is amplified corresponding to a value of the gain controlling signal. In addition, the collector current of the first transistor is negatively fed back to the prior stage amplifier circuit, whereby the amplification factor is improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
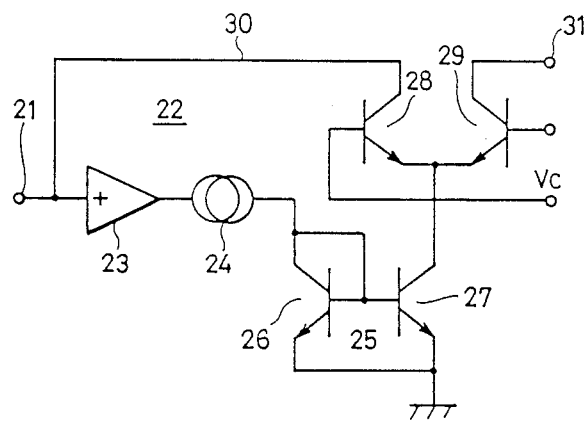
FIG. 1 is a circuit diagram showing one embodiment of the present invention.
Figure 3:
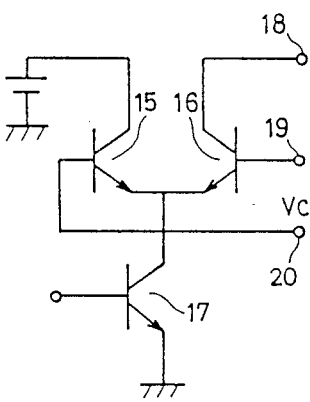
FIG. 3 is a circuit diagram showing a conventional gain controlled amplifier circuit.

FIG. 1 is a circuit diagram showing one embodiment of the present invention, wherein 21 denotes an input terminal to which an input signal to be amplified such as $L_T$ or $R_T$ is applied, 22 denotes a prior stage amplifier circuit comprising an amplifying portion 23 for amplifying the input signal applied to the input terminal 21 and a current generating a portion 24 for generating a current corresponding to an output signal of the amplifying portion 23, 25 denotes a current mirror circuit comprising a diode-connected transistor 26 and a current source transistor 27 connected to the transistor 26 to form a current mirror relation for generating an output current corresponding to the output current of the current generating portion 24, 28 and 29 denote first and second transistors having their commonly connected emitters connected to a collector of the constant current transistor 27 wherein a gain controlling signal is applied between bases of the first and second transistors, 30 denotes a negatively feedback path for negative feeding back a collector current of the first transistor 28 to an input end of the amplifying portion 23, and 31 denotes an output terminal connected to a collector of the second transistor 29.

Now, assuming that a gain of the amplifying portion 23 is large enough, the input terminal of the amplifying portion 23 can be regarded as a ground, so that relationship between an input current $i_{IN}$ and a collector current $i_1$ of the first transistor 28 will be represented in the following equation:

$$i_{IN} = i_1 \qquad (5)$$

Since a collector current $i_2$ of the second transistor 29 is derived from the output terminal 31 as an output current $i_{OUT}$, the following equation can be obtained:

$$\frac{i_{OUT}}{i_{IN}} = \frac{i_2}{i_1} = \exp\left(\frac{qV_c}{kT}\right) \qquad (6)$$

Accordingly, linearity of gain for a gain controlling signal is improved, thereby improving characteristics such as a distortion factor.

Figure 4:
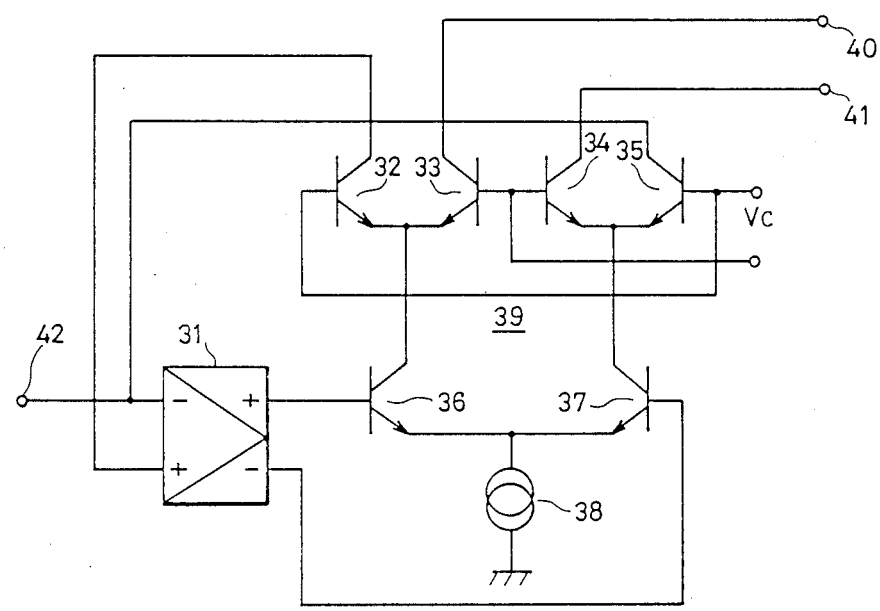
FIG. 4 is a circuit diagram showing another embodiment of the present invention.
Figure 2:
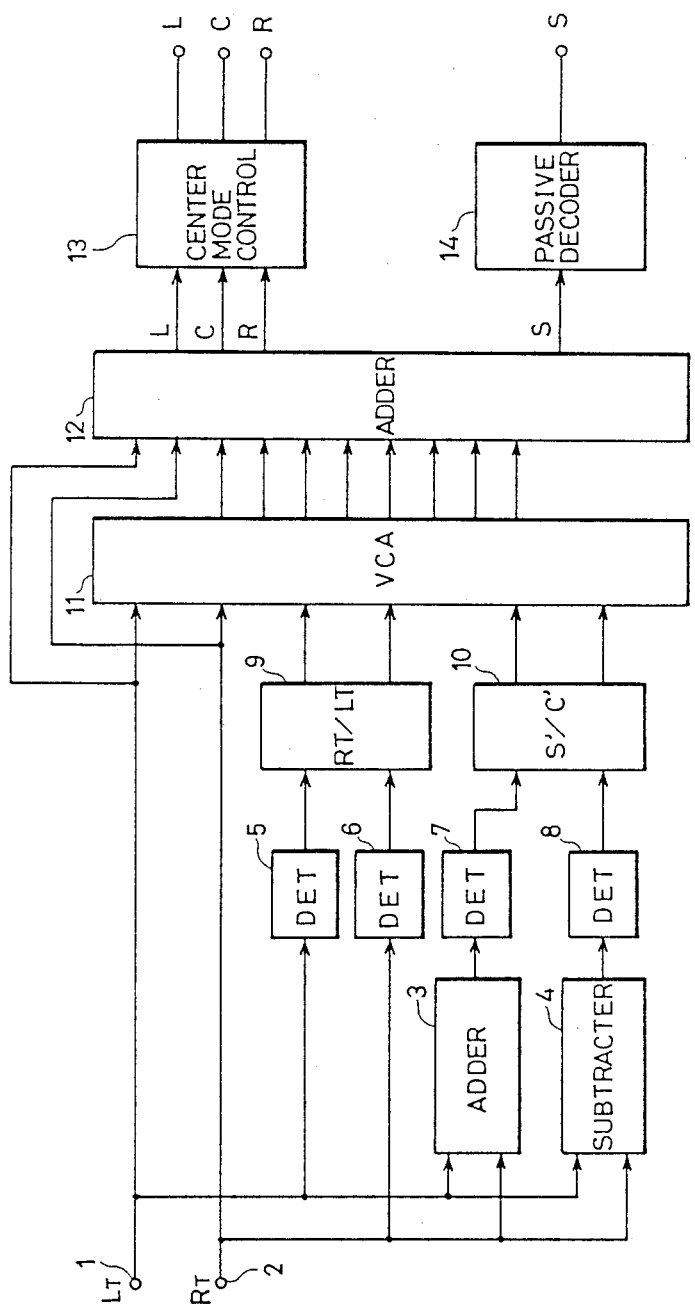
FIG. 2 is a schematic block diagram showing a surround-decoder system to which a gain controlled amplifier circuit of the present invention is applied.

FIG. 4 is circuit diagram showing another embodiment of the present invention, comprising a prior stage amplifier circuit 31 having differential inputs and differential outputs, and a double differential amplifier circuit 39. The double differential amplifier circuit 39 is comprised of first and second transistors 32 and 33 having their emitters connected in common, third and fourth transistors 34 and 35 having their emitters connected in common, a fifth transistor 36 having its collector connected to the common emitter of the first and the second transistors 32 and 33, a sixth transistor 37 having its collector connected to the common emitter of the third and the fourth transistors 34 and 35, and a constant current source 38 connected to the common emitter of the fifth and sixth transistor 36 and 37. Differential output signals of the prior stage amplifier circuit 31 are applied between bases of the fifth and the sixth transistors 36 and 37, and a gain controlling signal Vc is applied to the bases of the first through the fourth transistors 32-35. In addition, collector currents of the first and the fourth transistors 32 and 35 are negatively fed back to the differential input of the prior stage amplifier circuit 31, collector currents of the second and the third transistors 33 and 34 are supplied to first and second output terminals 40 and 41, respectively. Also in the gain controlled amplifier circuit of FIG. 4, a current gain is determined corresponding to the gain controlling signal Vc, and an input signal applied to an input terminal 42 is amplified by a gain shown in equation (6).

Figure 5:
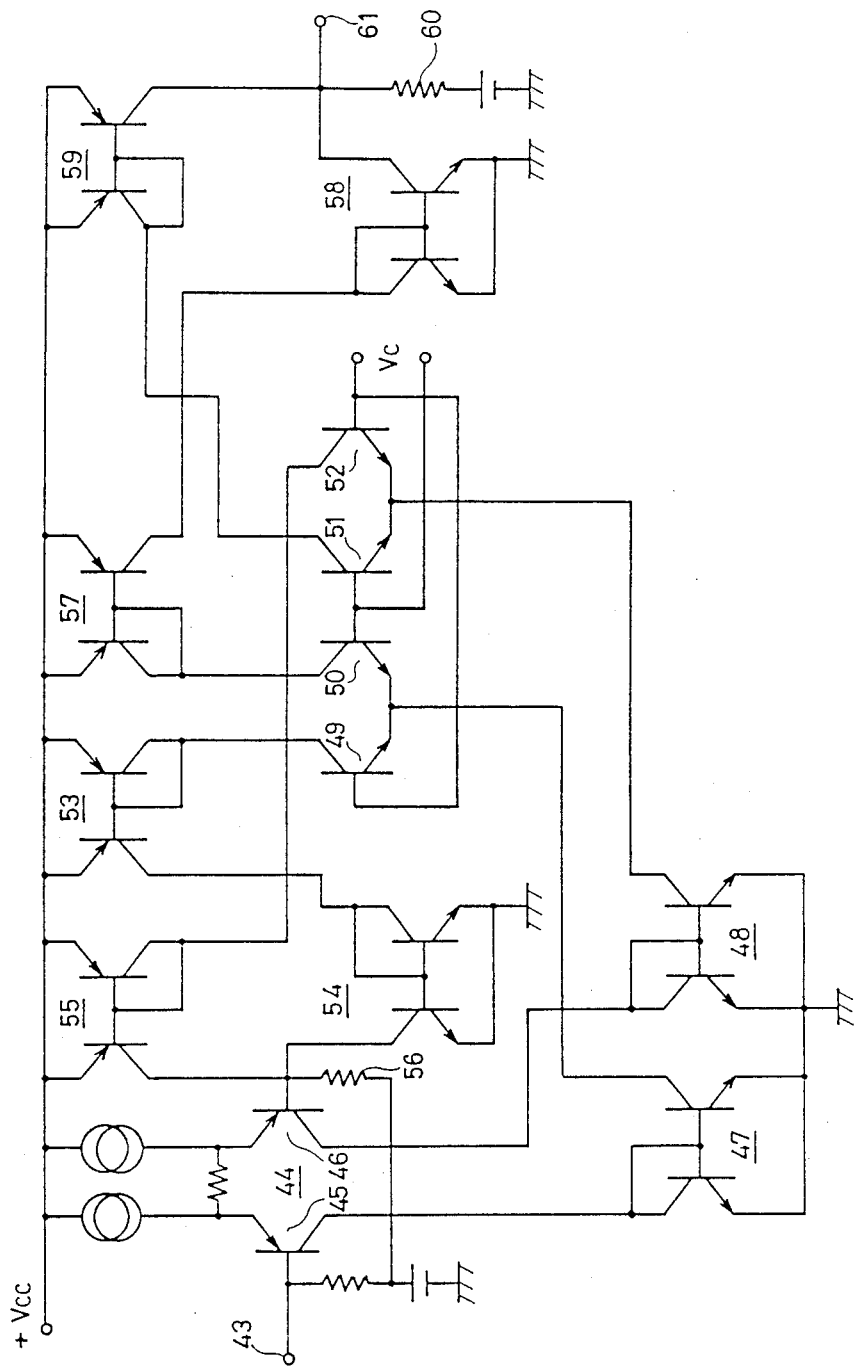
FIG. 5 is a detailed circuit of the embodiment shown in FIG. 4.

FIG. 5 is a circuit diagram showing an example of the gain controlled circuit shown in FIG. 4. In FIG. 5, an input signal applied to an input terminal 43 is amplified in a differential amplifier circuit 44 forming a prior stage amplifier circuit. Collector currents of differentially connected seventh and eighth transistors 45 and 46 are inverted in first and second current mirror circuits 47 and 48, respectively, to be supplied to emitters of first through fourth transistors 49-52. On the other hand, since a gain controlling signal Vc is applied to bases of the first through the fourth transistors 49-52, collector currents of the first through the fourth transistors 49-52 correspond to a value of the gain controlling signal Vc. The collector current of the first transistor 49 is inverted in the third and the fourth current mirror circuits 53 and 54. In addition, the collector current of the fourth transistor 52 is inverted in a fifth current mirror circuit 55. Then, a difference current between an output current of the fourth current mirror circuit 54 and an output current of the fifth current mirror circuit 55 is supplied to a bias resistance 56. If an input voltage applied to the input terminal 43 is represented as $V_{IN}$ and a resistance value of the bias resistance 56 is $R_1$, the following equation will be obtained:

$$V_{IN}=R_1 \cdot i_x \quad (7)$$

wherein $i_x$: current flowing through bias resistance 56

On the other hand, the collector current of the second transistor 50 is inverted through sixth and seventh current mirror circuits 57 and 58, and the collector current of the third transistor 51 is inverted through an eighth current mirror circuit 59. Then, a difference current between output currents of the seventh and the eighth current mirror circuits 58 and 59 is supplied to a load resistance 60, so that a voltage corresponding to the difference current is generated at an output terminal 61. If an output voltage is represented as $V_{OUT}$, and a value of the load resistance 60 is $R_2$, the following equation will be obtained:

$$V_{OUT}=R_2\, i_y \quad (8)$$

wherein $i_y$: current flowing through load resistance 60

In addition, if the collector currents of the first through the fourth transistors 49–52 are represented as $i_1$–$i_4$, respectively, the following equations will be obtained:

$$\frac{I_2}{I_1} = \exp\frac{qV_c}{kT} \quad (9)$$

$$\frac{I_4}{I_3} = \exp\frac{qV_c}{kT} \quad (10)$$

Thus, from equations (7)–(10), a voltage gain will be as the following equation:

$$\frac{V_{OUT}}{V_{IN}} = \frac{R_2(I_3 - I_2)}{R_1(I_4 - I_1)} = \frac{R_2}{R_1} \exp\frac{qV_c}{kT} \quad (11)$$

Accordingly, the circuit of FIG. 5 can be a gain controlled amplifier circuit in which a voltage gain is set by a ratio between the bias resistance 56 and the load resistance 60 and a gain controlling voltage.

As described above, according to the embodiments of the present invention, a gain controlled amplifier circuit having an improved distortion factor and operating stably can be provided. Particularly, since a gain can be set accurately only by equalizing characteristics of differentially connected transistors applied with the control signal, linearity of control can be improved significantly to extend a control range. Therefore, a gain controlled amplifier circuit especially suitable for an integrated circuit can be provided. In addition, since a control signal is applied to bases of differentially connected transistors, a reference voltage of the control signal can be set optionally so as to increase flexibility of design and to be used for an apparatus of a lower power supply voltage.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A gain controlled amplifier circuit comprising:
    input means for providing an input signal;
    a prior stage amplifier circuit for amplifying said input signal, having a first input transistor having a base supplied with said input signal and providing a first output current from a collector and a second input transistor differentially connected to said first input transistor and providing a second output current from a collector;
    first and second transistors differentially connected to each other, each having a base, an emitter and a collector;
    third and fourth transistors differentially connected to each other, each having a base, an emitter and a collector;
    a fifth transistor having a base, an emitter and a collector, the collector of said fifth transistor being connected to the emitters connected in common of said first and second transistors, and the base of said fifth transistor being connected to the collector of said first input transistor;
    a sixth transistor having a base, an emitter and a collector, the collector of said sixth transistor being connected to the emitters connected in common of said third and fourth transistors, and the base of said sixth transistor being connected to the collector of said second input transistor;
    gain control means for providing a gain controlling signal to the bases of said first through fourth transistors;
    a negative feedback path for negative feeding back controller currents of said first and fourth transistors to the base of said second input transistor; and
    output terminals for providing collector currents of said second and third transistors as output signals.

2. A gain controlled amplifier circuit according to claim 1, further comprising:
    a seventh transistor having a collector and base connected in common to (a) the collector of said first input transistor and (b) the base of said fifth transistor;
    an eighth transistor having a collector and base connected in common to (c) the collector of said second input transistor and (d) the base of said sixth transistor; and
    said fifth and seventh transistors constituting a first current mirror circuit and said sixth and eighth transistors constituting a second current mirror circuit.

3. A gain controlled amplifier circuit according to claim 1, further comprising means for providing collector output currents of said second and third transistors in common to a load resistance.

4. A gain controlled amplifier circuit according to claim 3, wherein said prior stage amplifier circuit further includes,
    a first resistance connected between a reference power supply and the base of said first input transistor,
    a second resistance connected between the reference power supply and the base of said second input transistor, and
    the gain of the gain controlled amplifier being determined based on said load resistance, said second resistance and said gain controlling signal.

* * * * *